United States Patent [19]
Hsue et al.

[11] Patent Number: 5,554,560
[45] Date of Patent: Sep. 10, 1996

[54] METHOD FOR FORMING A PLANAR FIELD OXIDE (FOX) ON SUBSTRATES FOR INTEGRATED CIRCUIT

[75] Inventors: Chen-Chiu Hsue; Sun-Chieh Chien; Ming-Hua Liu, all of Hsin-chu, Taiwan

[73] Assignee: United Microelectronics Corporation, Hsin-chu, Taiwan

[21] Appl. No.: 315,772

[22] Filed: Sep. 30, 1994

[51] Int. Cl.⁶ .................................................. H01L 21/76
[52] U.S. Cl. .................. 437/69; 437/70; 437/72; 437/73
[58] Field of Search ................... 437/69, 70, 72, 437/73

[56] References Cited

U.S. PATENT DOCUMENTS

| | | | |
|---|---|---|---|
| 4,398,992 | 8/1983 | Fang et al. | 456/646.1 |
| 4,539,744 | 9/1985 | Burton | 29/580 |
| 5,169,801 | 12/1992 | Sato | 437/195 |
| 5,236,861 | 8/1993 | Otsu | 437/67 |
| 5,246,537 | 9/1993 | Cooper et al. | 437/69 |
| 5,324,689 | 6/1994 | Yoo | 437/69 |
| 5,374,585 | 12/1994 | Smith et al. | 437/70 |
| 5,413,953 | 5/1995 | Ghien et al. | 437/69 |

FOREIGN PATENT DOCUMENTS

| | | | |
|---|---|---|---|
| 0209534 | 7/1992 | Japan | 437/69 |
| 0151418 | 5/1994 | Japan | 437/69 |

*Primary Examiner*—Trung Dang
*Attorney, Agent, or Firm*—William H. Wright

[57] ABSTRACT

An improved process for fabricating a planar field oxide structure on a silicon substrate was achieved. The process involves forming the field oxide by using the LOCal Oxidation of Silicon (LOCOS) process in which the device area is protected from oxidation by a silicon nitride layer. A sacrificial leveling layer, such as spin-on-glass (SOG) or a anti-reflective coating (ARC) layer is used to fill in the gap between the silicon nitride and the field oxide structure and make more planar the substrate surface. The leveling layer is then etched back non-selectively by plasma etching to planarize the portion of the field oxide extending above the substrate surface. The method does not require a recess to be etched in the silicon substrate and therefore, has certain reliability and cost advantages.

18 Claims, 4 Drawing Sheets

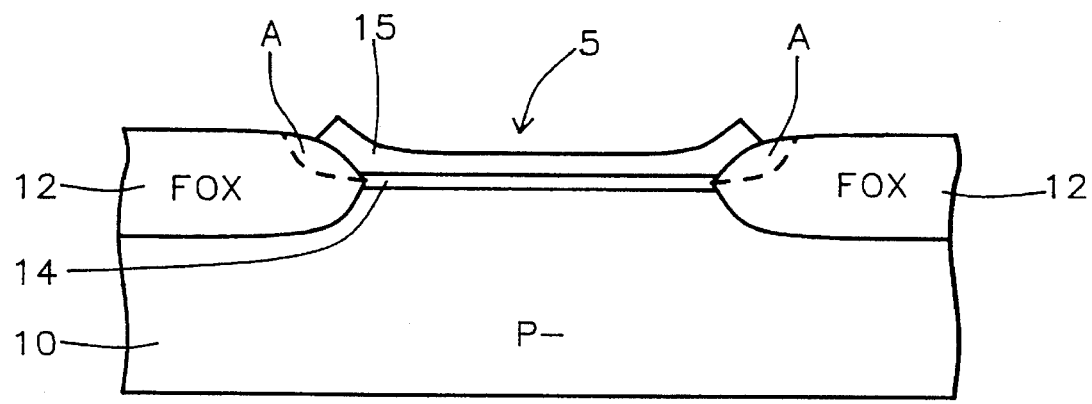
*FIG. 1 - Prior Art*
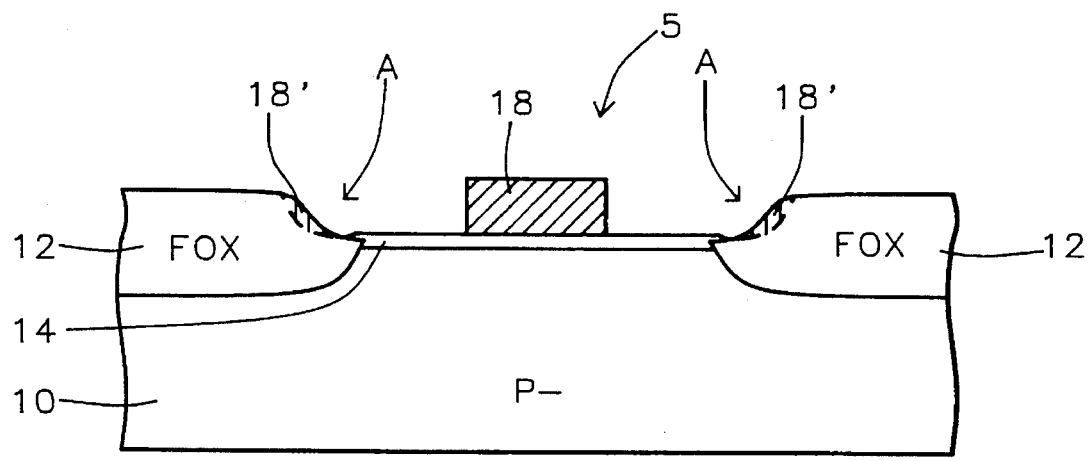
*FIG. 2 - Prior Art*

METHOD FOR FORMING A PLANAR FIELD OXIDE (FOX) ON SUBSTRATES FOR INTEGRATED CIRCUIT

BACKGROUND OF THE INVENTION

1. Field of the Invention

The present invention relates to the fabrication of integrated circuit devices on semiconductor substrates, More particularly the invention is directed to a method for planarizing the Field OXide (FOX) on a silicon substrate formed by the LOCal Oxidation of Silicon (LOCOS).

2. Description of the Prior Art

Today's Ultra Large Scale Integration (ULSI) on the semiconductor substrate is in part due to advances in high resolution photolithographic techniques and to advances in plasma etching of the various conducting and insulating layers on the substrate. However, the accumulated effect of depositing and etching of patterns in these layers, one patterned layer on top of the other, has resulted in irregular or substantially non-planar surfaces with micrometer and submicrometer feature sizes on an otherwise microscopically planar substrate.

These irregular surface features cause a number of process and reliability problems. For example, during plasma etching to pattern conducting layers, the directional or anisotropic etching can leave residue, often referred to as rails or stringers at the edges of the underlying surfaces irregularities. This results from the fact that conformal conducting layers formed over steps are thicker in the vertical direction on the sidewall of the step than they are on the horizontal surface. The directionality of the plasma etching which etches predominantly in the vertical direction leaves residue from the conducting layer on the sidewalls of the step. This then results in electrical shorts between adjacent patterned conducting layers that are used to connect or wire up the various devices.

One processing area where this residue can be a major problem is the patterning by anisotropic etching of the polysilicon gate electrode for FETs and the word and bit lines that are used on integrated circuit, such as on DRAMS, SRAMs and microprocessor chips.

This problem can be better understood by referring to FIGS. 1 and 2. In FIG. 1 is shown a schematic cross-section of a substrate 10 having a typical device area 5 whereon the gate electrode of the FET is formed and with a Field OXide (FOX) structure 12 formed in and on the silicon substrate 10 and surrounding the device area. Typically the conventional field oxide isolation 12 is formed using a LOCal Oxidation of Silicon (LOCOS) process in which the device area 5 is masked with a thin protective pad oxide 14 and a thicker silicon nitride layer 16 that is a barrier to oxidation. The silicon substrate is then oxidized to form the field oxide 12 having a thickness of about 4500 to 5500 angstroms.

By the nature of the oxidation, which results in a volume expansion, approximately one half of the oxide thickness extends above the original substrate surface and about one half below the surface. In addition, portions of this thermally grown oxide near the silicon nitride edge are highly stressed, as indicated by an A in FIG. 1. These highly stained areas tend to etch at a faster rate when wet etched, for example, when the pad oxide layer 14 is removed in a buffered hydrofluoric acid.

As shown in FIG. 2, when the silicon nitride layer 16 and the pad oxide layer 14 are removed from over the device area 5 and a polysilicon gate electrode 18 is patterned over a thin gate oxide 15 by photoresist masking and anisotropic etching, there remains on the edge of the field oxide residual polysilicon 18' which is difficult to remove without excessive over etching.

The reliability of conducting lines formed over large steps in the underlying substrate is also of major concern. For example, thinning of the line or voids formed therein can be a source of electrical failure when the circuit is powered up.

One general approach in the semiconductor industry to circumvent these topographic problems, is to provide a planar surface on which the conducting layer is patterned. A method commonly used to form a planar field oxide, is to first recess the silicon substrate in the field oxide area by etching a trench and then growing a thermal oxide therein. Alternatively, the recess can be filled using a chemical vapor deposited (CVD) silicon oxide and then planarized, for example, by chemical/mechanical polishing the CVD oxide to remove the raised portion of the CVD oxide. Another approach is to fill the recess with CVD oxide and then planarize the CVD oxide by applying a leveling material such as spin-on-glass (SOG) and etching back the SOG and the CVD to the substrate surface using a non-selective plasma etching. This later approach using a CVD oxide filled recess process is described by T. Otsu in U.S. Pat. No. 5,236,861. Another method for forming a planar thermal oxide in a recessed field oxide area is described by G. Burton in U.S. Pat. No. 4,539,744.

Although recessing the field oxide area and then filling with a deposited or thermally grown oxide, is a viable process, there are a number of concerns. For example, forming recesses in the single crystal silicon substrate having sharp corners and then forming a thick thermal oxide can lead to crystalline defects that can degrade device performance. Also the process complexity is increased with increasing manufacturing costs. Therefore, there is a strong need to provide a simple and effective method for forming a planar field oxide without the necessity of forming recesses in the silicon substrate.

SUMMARY OF THE INVENTION

It is the principle object of this invention to provide an improved field oxide isolation structure on a silicon substrate having a planar surface.

It is another object of the invention to provide a planar field oxide structure that does not require etching a recess in the silicon substrate.

It is still another object of the invention to provide a planarizing field oxide process which is cost effective for manufacturing.

In accordance with these objectives the invention teaches a new method for forming planar field oxide regions for electrically isolating the device areas on a silicon substrate and providing a planar surface upon which the conductive layers, having submicrometer feature sizes, can be patterned. The patterned conductive layer being free of residue at the edges of the underlying field oxide areas that would otherwise cause electrical shorts on a less planar surface.

The method begins by providing a semiconductor substrate having a planar surface, such as single crystal silicon. The principle surface of the substrate is then thermally oxidized to form a thin stress-free silicon oxide layer, usually referred to as a pad oxide. A first insulating layer, such as silicon nitride, is then deposited over the pad oxide and provides an oxidation barrier. The silicon nitride layer is then patterned using conventional photolithographic techniques and anisotropic plasma etching leaving portions over the areas required for active device areas and exposing the silicon surface elsewhere on the substrate. The photoresist mask is then removed.

The substrate is next subjected to a thermal oxidation step, thereby forming a relatively thick Field OXide (FOX) in the exposed substrate areas while the silicon nitride layer masks the device areas from oxidation.

Relating now more specifically to the objects of this invention, a sacrificial planarizing or leveling layer is coated on the substrate, thereby filling in the gaps between the patterned silicon nitride layer and the raised portion of the surrounding field oxide. The leveling layer, being, for example a spin-on-glass or an anti-refection coating. The leveling layer and raised portion of the field oxide structure is then etched back forming a planar field oxide structure essentially coplanar with the substrate surface area in the device area. The silicon nitride layer and the pad oxide layer is then removed completing the planar field oxide structure of the invention.

BRIEF DESCRIPTION OF THE DRAWINGS

The object and other advantages of this invention are best explained in the preferred embodiment with reference to the attached drawings that include:

FIGS. 1 and 2 schematically illustrates in cross sectional representation the nature of the residue problem solved by this invention.

DESCRIPTION OF THE PREFERRED EMBODIMENTS

Now in keeping with the objects of the invention, the method for planarizing the field oxide structure formed by the LOCal Oxidation of Silicon (LOCOS) process is covered in detail. This planar field oxide structure is used to electrically isolate the active device areas for devices, such as field effect transistors (FETs) that are currently used in the manufacture of DRAMs, SRAM, microprocessor and other similar circuits.

Although the invention is described for use with FET device structures, it should be well understood by one skilled in the art that the planar field oxide structure can be used for other integrated circuit applications, such as shallow isolation on bipolar circuits and the likes. Although the invention is shown for a P-doped substrate, for simplicity, it should also be understood that the invention equally applies to N-doped substrates and to substrates having N and P-wells from which CMOS circuits can be built.

Figure 3:
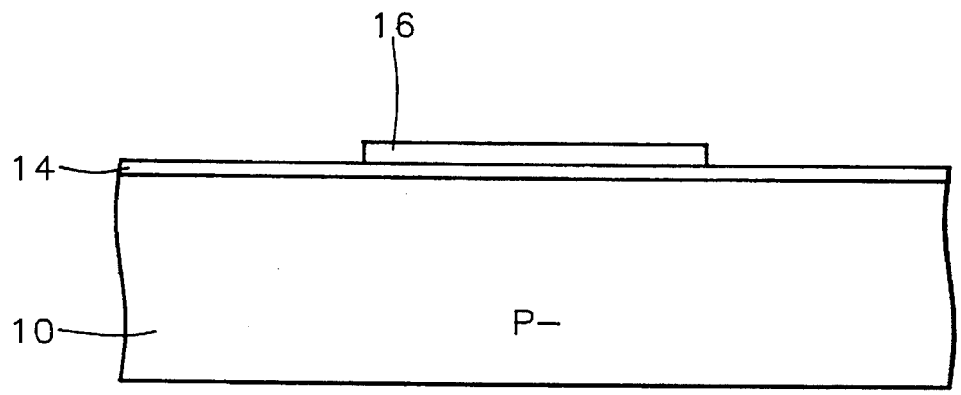
FIGS. 3 through 7 schematically illustrates in cross section representation the preferred embodiment of forming the planar field oxide structure using a timed etch in which a silicon nitride oxidation barrier layer is also etched during the planarizing etch back.

Referring now to FIG. 3, a schematic cross-sectional view of a silicon substrate 10 is shown, having a relatively thin thermally grown oxide layer 14 formed on the substrate surface and usually referred to as the pad oxide. The layer 14 is typical between about 100 to 500 Angstroms thick and is formed having a low stress. A thicker silicon nitride layer 16 is then deposited on the pad oxide layer 14. The method of choice for depositing the silicon nitride is by low pressure chemical vapor deposition (LPCVD) at the relatively high temperature of between about 700° to 800° C. The preferred thickness being between about 1000 to 2500 Angstroms.

The silicon nitride layer is then patterned using conventional photolithographic techniques and plasma etching, as shown in FIG. 3, to leave portions of the silicon nitride layer 16 over the device areas, as defined by the mask set for the specific product being built.

Figure 4:
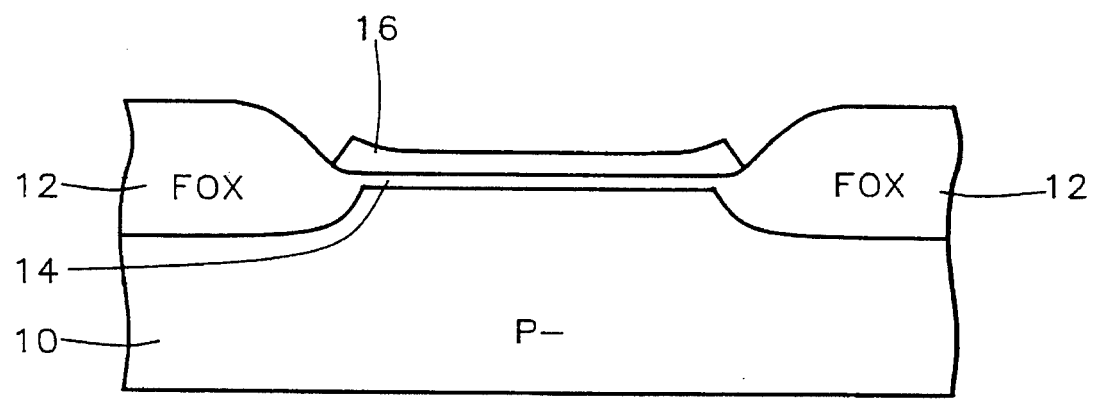

Referring now to FIG. 4, the field oxide 12 is formed by selective thermal oxidation of the surface in the exposed silicon areas, while the silicon nitride layer 16 prevents oxidation in the device areas. This method of forming the field oxide is commonly used in the semiconductor industry and referred to as LOCal Oxidation of Silicon (LOCOS). If required to prevent surface inversion, a P-type dopant, such as boron can be implanted in the field oxide area, prior to forming the field oxide. This is commonly done to avoid leakage currents or shorts from occurring between device areas. For this invention, the preferred thickness of the field oxide is between about 4000 to 8000 Angstroms.

As also shown in FIG. 4, the formation of the field oxide 12, by the nature of the thermal oxidation has approximately one half of the total thickness extending upward above the substrate surface and about one half extending below the substrate surface. The relatively large oxide step at the fields oxide edge, about 2000 to 4000 Angstroms in height, can result in residual polysilicon remaining when the overlying polysilicon layers are patterned by anisotropic etching. This residue, often referred to as strings or rails, can occur when polysilicon gate electrodes and word lines are formed on product, such as DRAM and SRAM chips. This problem is depicted in FIG. 2, but not shown in FIG. 4.

Referring now more specifically to the objective of this invention the method of eliminating this problem by forming a planar field oxide by planarizing the LOCOS is now described in detail.

Figure 5:
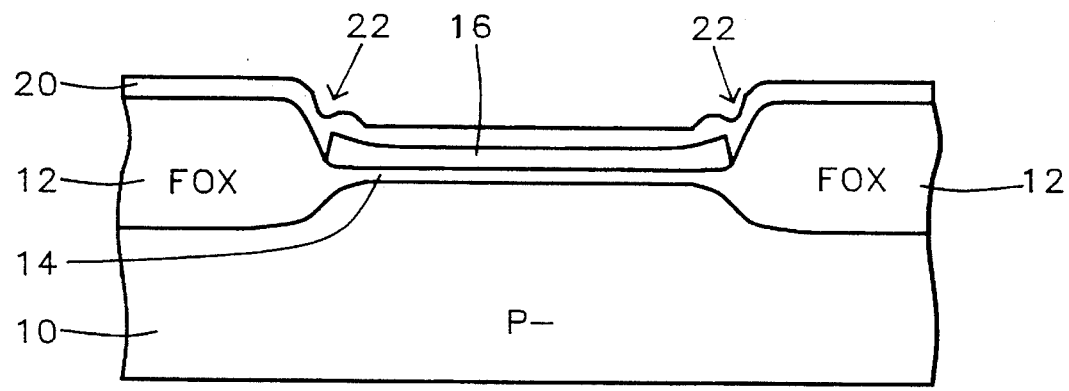

As shown in FIG. 5, a thin leveling layer 20 is formed over the field oxide 12 and the silicon nitride layer 16 filling the gap 22 between the silicon nitride and field oxide edges. The preferred leveling layer 20 is composed of a spin-on-glass liquid having a low viscosity. The preferred spin-on-glass (SOG) consists of a silicon-oxide (Si-O) network polymer dissolved in a common organic solvent, such as alcohol, ketones or esters. And more specifically the preferred spin-on-glass is from the series of silicate or siloxane base materials marketed by the Allied-Signal Corporation.

Referring now more particularly to the method of coating the substrate, the spin-on-glass is deposited by using a conventional spin coater, such as used for coating photoresist, and dispensing the liquid spin-on-glass at a rotational speed of between about 3000 to 6000 rpm (revolutions per minute). The spin-on-glass layer is then baked at a temperature of about 80° to 300° C. for about 1 minute and then cured at a temperature 400° to 450° C. for about 30 to 60 minutes. The preferred thickness of the spin-on-glass layer 20 is between about 300 to 1000 Angstroms.

An alternative material that can be used as the leveling layer is an Anti-Reflection Coating (ARC) composed, for example, of a polymer. For example, a material that can be used as layer 20 is an anti-reflective coating, such as type TSP-4 manufactured by the Tokyo Ohka Kogyo Co. of Japan. Other example of anti-reflective coating materials that can be used include perfluoroalkylpolyether (PFAE) supplied by Montefluos, polysiloxane (SH410) supplied by Toray Industries, polyethylvinylether (PEVE) produced by Scientific Polymer Products Incorporated and polyvinylalcohol (PVA) provided by Kurare, Incorporated. The antireflective coating PFAE can be removed in FREON TF provided by the Mitsui Dupont Fluoro Chemical company and polysiloxane is removed in xylene, while PEVE and PVA are water soluble. The advantage Of using these particular anti-reflective coating is that they can be easily removed by solvents or in water.

The anti-reflection coatings are also applied by spin coating at a preferred rotation spin speed of between about 3000 to 5000 rpm and then bake a temperature of between about 80° to 200° C. for about 1 minute. The preferred thickness of the ARC layer being between about 300 to 800 Angstroms.

Figure 6:
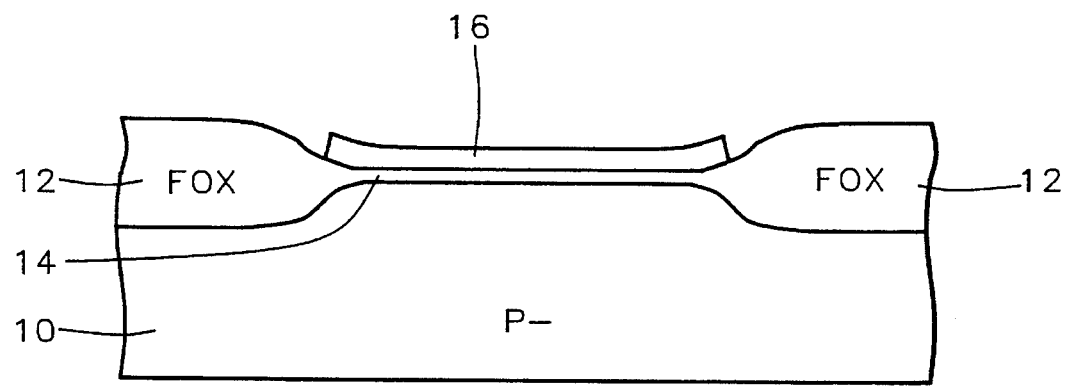

Now as shown in FIG. 6, the leveling layer 20 composed of the spin-on-glass is etched back, exposing the raised portion of the field oxide structure 12 and thereafter simultaneously etching both layers by time to a predetermined depth below the original top surface of the silicon nitride layer 16. The preferred depth below the original top surface of the silicon nitride layer 16 being between about 500 to 2000 Angstroms. In this embodiment the etch selectivity between the spin-on-glass, the field oxide and the silicon nitride are about 1:1:1, that is the etching is non-selective.

The etching is preferably done in a plasma etcher, such as a reactive ion etcher or a high ion density low pressure etcher, for example having a microwave ion source. More specifically the preferred etching is done in a TEL 5000 etcher manufactured by the TEL Corporation. The preferred etch conditions for achieving a non-selective etch is in a gas mixture of trifluoromethane ($CHF_3$), carbon tetrafluoride ($CF_4$) and argon (Ar), at an operating pressure of between about 50 to 150 milliTorr and at a RF (radio frequency) power of 300 watts.

For the planarization process using the ARC layer as the leveling layer 20, the planarizing etch back is also performed in a plasma etcher. And more particularly, the etching is also carried out in a TEL 5000 type etcher manufactured by the TEL Corporation. The preferred etching in done in a gas mixture of $CHF_3$, $CF_4$ and Ar, at an operating pressure of between about 50 to 150 milliTorr and at a RF power of between about 200 to 400 watts.

Figure 7:
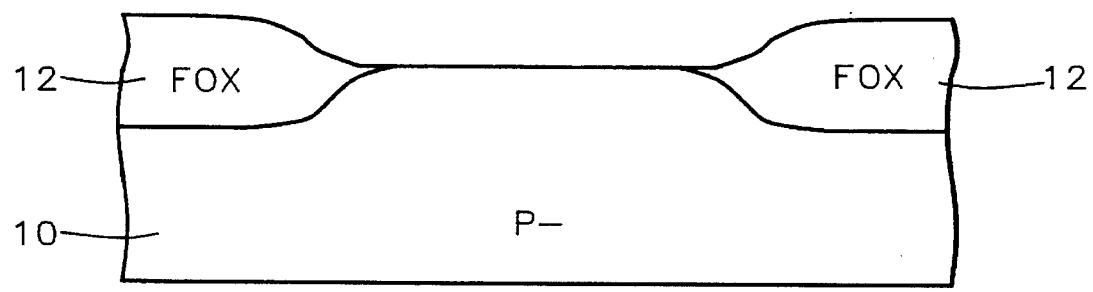

After the planarizing etch back the remaining silicon nitride layer 16 and the pad oxide 14, as shown in FIG. 6 are removed. For example, the silicon nitride is etched in a hot phosphoric acid and the pad oxide 14 is removed by a short etch in a diluted hydrofluoric acid. The completed planar field oxide structure 12 formed by planarizing the LOCOS structure is shown in FIG. 7. The silicon substrate surface is now sufficiently planar to form the polysilicon gate electrodes and other patterned conducting layers by anisotropic plasma etching without forming residue, such as stringers or rails.

While the invention has been particularly shown and described with .reference to the preferred embodiments thereof, it will be understood by those skilled in the art that various changes in form and details may be made without departing from the spirit and scope of the invention.

What is claimed is:

1. A method for fabricating planar field oxide (FOX) isolation areas on a silicon substrate having device areas thereon, comprising the steps of:

providing a silicon substrate having a principal surface that is planar;

thermally oxidizing said silicon substrate principal surface and thereby forming a silicon oxide pad layer;

depositing a first insulating layer on said silicon oxide pad layer and thereby forming a barrier layer to oxidation;

patterning said first insulating layer and said silicon oxide pad layer by photoresist masking and anisotropic etching, thereby leaving portions of said first insulating layer and silicon oxide pad layer over said device areas and exposing elsewhere said substrate surface;

removing said photoresist masking;

thermally oxidizing said silicon substrate forming a Field OXide (FOX) structure composed of silicon oxide on and in said exposed surface areas, a portion of which extends upward above the surface of said substrate and surrounds said device areas;

forming on said silicon substrate a leveling layer and thereby filling the gaps between said patterned first insulating layer and raised portion of said field oxide structures, wherein said leveling layer is a spin-on-glass layer having a thickness of between about 300 to 1000 Angstroms;

blanket etching back said leveling layer, said field oxide structure and said first insulating layer non-selectively by a timed etch thereby planarizing said field oxide structure;

removing said remaining first insulating layer and said silicon oxide pad layer and thereby completing said planar field oxide structure surrounding and isolating said device areas.

2. The method of claim 1, wherein said silicon oxide pad layer is thermally grown to a thickness of between about 100 to 500 Angstroms.

3. The method of claim 1, wherein the first insulating layer is composed of silicon nitride ($Si_3N_4$) having a thickness of between about 1000 to 2500 Angstroms.

4. The method of claim 1, wherein said spin-on-glass is of the siloxane type.

5. The method of claim 1, wherein said spin-on-glass is cured by annealing at a temperature of between about 400° to 450° C. for a time of between 30 to 60 minutes.

6. The method of claim 1, wherein said blanket back etching is performed in a reactive ion etcher having an etch selectivity of about 1:1 between silicon oxide and spin-on-glass.

7. The method of claim 1, wherein said blanket etching of said leveling layer and field oxide structure is to a depth of about between 500 to 1000 Angstroms below the initial top surface of said first insulating layer.

8. The method of claim 1, wherein said etch rate selectivity of said first insulating layer to silicon oxide is 1 to 1.

9. A method for fabricating planar field oxide (FOX) isolation areas on a silicon substrate having device areas thereon, comprising the steps of:

providing a silicon substrate having a principle surface that is planar;

thermally oxidizing said silicon substrate principle surface and thereby forming a silicon oxide pad layer;

depositing a first insulating layer on said silicon oxide pad layer and thereby forming a barrier layer to oxidation;

patterning said first insulating layer and said silicon oxide pad layer by photoresist masking and anisotropic etching, thereby leaving portions of said first insulating layer and silicon oxide pad layer over said device areas and exposing elsewhere said substrate surface;

removing said photoresist masking;

thermally oxidizing said silicon substrate forming a Field OXide (FOX) structure composed of silicon oxide on and in said exposed surface areas, a portion of which extends upward above the surface of said substrate and surrounds said device areas;

forming on said silicon substrate a leveling layer composed of spin-on-glass and thereby filling the gaps between said patterned first insulating layer and raised portion of said field oxide structures;

blanket etching back said spin-on-glass layer and field oxide structure to a depth below the original top surface of said first insulating layer by a timed etch thereby planarizing said field oxide structure;

removing said first insulating layer and said silicon oxide pad layer and thereby completing said planar field oxide structure surrounding and isolating said device areas.

10. The method of claim 9, wherein said silicon oxide pad layer is formed by thermal oxidation to a thickness of between about 100 to 500 Angstroms.

11. The method of claim 9, wherein the first insulating layer is composed of silicon nitride ($Si_3N_4$) having a thickness of between about 1000 to 2500 Angstroms.

12. The method of claim 9, wherein said spin-on-glass layer is of the siloxane type.

13. The method of claim 9, wherein said spin-on-glass layer is of the silicate type.

14. The method of claim 13, wherein said spin-on-glass is cured by annealing at a temperature of between about 400° to 450° C. for a time of between 30 to 60 minutes.

15. The method of claim 9, wherein said blanket back etching is performed in a reactive ion etcher having an etch selectivity of about 1:1 between silicon oxide and spin-on-glass.

16. The method of claim 9, wherein said leveling layer is an anti-reflective coating (ARC) composed of a polymer and having an etch selectivity to silicon oxide of about 1:1 in a reactive ion etcher.

17. The method of claim 16, wherein said anti-reflective coating is baked at a temperature of between about 80° to 200° C. and is between about 300 to 800 Angstroms in thickness.

18. The method of claim 9, wherein said blanket etching of said leveling layer and field oxide structure is to a depth of about between 500 to 1000 Angstroms below the original top surface of said first insulating layer.

* * * * *